(12) United States Patent
Yamaguchi

(10) Patent No.: US 9,834,839 B2
(45) Date of Patent: Dec. 5, 2017

(54) CYLINDRICAL SPUTTERING TARGET, CYLINDRICAL COMPACT, MANUFACTURING METHOD OF CYLINDRICAL SPUTTERING TARGET, AND MANUFACTURING METHOD OF CYLINDRICAL SINTERED COMPACT

(71) Applicant: JX NIPPON MINING & METALS CORPORATION, Tokyo (JP)

(72) Inventor: Yohei Yamaguchi, Kitaibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 15/082,035

(22) Filed: Mar. 28, 2016

(65) Prior Publication Data
US 2016/0281214 A1    Sep. 29, 2016

(30) Foreign Application Priority Data
Mar. 27, 2015    (JP) .................... 2015-067552

(51) Int. Cl.
*C23C 14/34*    (2006.01)
*C23C 14/08*    (2006.01)
(Continued)

(52) U.S. Cl.
CPC .......... *C23C 14/3414* (2013.01); *C04B 35/01* (2013.01); *C04B 35/453* (2013.01); *C04B 35/457* (2013.01); *C23C 14/086* (2013.01); *C23C 14/3407* (2013.01); *H01J 37/3423* (2013.01); *H01J 37/3426* (2013.01); *H01J 37/3491* (2013.01); *C04B 2235/3284* (2013.01);
(Continued)

(58) Field of Classification Search
CPC ..... C04B 35/01; C04B 35/453; C04B 35/457; C04B 2235/3284; C04B 2235/3293; C04B 2235/5409; C04B 2235/604; C04B 2235/608; C04B 2235/6562; C04B 2235/6567; C04B 2235/6585; C04B 2235/77; C04B 2235/94; C04B 2235/963; C23C 14/086; C23C 14/3407; C23C 14/3414; H01J 37/3423; H01J 37/3426; H01J 37/3491
USPC .............. 204/298.12, 298.13; 264/6, 12, 604
See application file for complete search history.

(56) References Cited

U.S. PATENT DOCUMENTS 6,080,341 A * 6/2000 Stenger ................ C04B 35/457
                                                                    264/12
2013/0299347 A1    11/2013 Rozak et al.

FOREIGN PATENT DOCUMENTS

JP    2000-144393    *    5/2000
JP    2011-225985 A    11/2011
(Continued)

OTHER PUBLICATIONS

Machine Translation JP 2000-144393 dated May 2000.*
(Continued)

*Primary Examiner* — Rodney McDonald
(74) *Attorney, Agent, or Firm* — Typha IP LLC

(57) ABSTRACT

A cylindrical sputtering target includes a plurality of cylindrical sintered compacts adjacent to each other while having a space therebetween. The plurality of cylindrical sintered compacts have a relative density of 99.7% or higher and 99.9% or lower. The plurality of cylindrical sintered compacts adjacent to each other have a difference therebetween in the relative density of 0.1% or smaller.

1 Claim, 4 Drawing Sheets

(51) Int. Cl.
*H01J 37/34* (2006.01)
*C04B 35/457* (2006.01)
*C04B 35/453* (2006.01)
*C04B 35/01* (2006.01)

(52) U.S. Cl.
CPC ............ *C04B 2235/3293* (2013.01); *C04B 2235/5409* (2013.01); *C04B 2235/604* (2013.01); *C04B 2235/608* (2013.01); *C04B 2235/6562* (2013.01); *C04B 2235/6567* (2013.01); *C04B 2235/6585* (2013.01); *C04B 2235/77* (2013.01); *C04B 2235/94* (2013.01); *C04B 2235/963* (2013.01)

(56) References Cited

FOREIGN PATENT DOCUMENTS

| JP | 2013-147368 A | 8/2013 |
|---|---|---|
| JP | 2013-204051 A | 10/2013 |
| JP | 2014-040348 A | 3/2014 |
| KR | 10-2015-000340 A | 1/2015 |
| KR | 10-2015-0003404 A | 1/2015 |
| TW | 201350459 A | 12/2013 |

OTHER PUBLICATIONS

Taiwanese Office Action dated Jul. 25, 2016 for corresponding Taiwanese Application No. 105107497 with partial translation.
Japanese Office Action dated Jul. 28, 2015 for the corresponding Japanese application No. 2015-067552.
Japanese Office Action dated Mar. 8, 2016 for the corresponding Japanese application No. 2016-004135.
Korean Office Action dated May 1, 2017 for corresponding KR Patent Application No. 10-2016-0031851, with partial.
Korean Office Action dated May 1, 2017 for corresponding KR Patent Application No. 10-2016-0031851, with partial translation.
Korean Office dated Sep. 14, 2017 for the corresponding Korean Patent application No. 10-2016-0031851.

\* cited by examiner

CYLINDRICAL SPUTTERING TARGET, CYLINDRICAL COMPACT, MANUFACTURING METHOD OF CYLINDRICAL SPUTTERING TARGET, AND MANUFACTURING METHOD OF CYLINDRICAL SINTERED COMPACT

CROSS REFERENCE TO RELATED APPLICATIONS

This application is based upon and claims the benefit of priority from the prior Japanese Patent Application No. 2015-067552 filed on Mar. 27, 2015, the entire contents of which are incorporated herein by reference.

FIELD

The present invention relates to a cylindrical sputtering target, a cylindrical sintered compact, a cylindrical compact and a manufacturing method of the same.

BACKGROUND

Recently, manufacturing technologies of flat panel displays (FPDs) and solar cells have been rapidly developed, and markets of large-screen thin TVs and solar cells have been expanded. Along with the expansion of the markets of these products, glass substrates have been progressively enlarged for the purpose of decreasing the manufacturing cost of the products. Today, manufacturing devices for the eighth generation glass substrates having a size of 2200 mm×2400 mm are being developed. Especially, in the field of sputtering devices for forming a metal thin film or a metal oxide thin film on a large glass substrate, a conventional flat sputtering target is now replaced with a cylindrical (also referred to as "rotary" or "rotatable") sputtering target. A cylindrical sputtering target has advantages over a flat sputtering target that the use efficiency of the target is high, the erosion occurs less, and generation of particles by delamination of deposited substances occurs less.

A cylindrical sputtering target usable for a sputtering device for forming a thin film on a large glass substrate as described above needs to have a length of at least 3000 mm. It costs high and thus is not practical to manufacture, by integral molding, and grind such a long cylindrical sputtering target. Therefore, usually, a plurality of cylindrical sintered compacts each having a length of several ten millimeters or greater and several hundred millimeters or less are coupled together to form a cylindrical sputtering target.

Generally, a sintered compact, encompassing the above-described cylindrical sintered compact, needs to have a high density in order to have an improved mechanical strength and also in order to allow a thin film formed of the sintered compact to have an improved film quality. In order to realize a sintered compact having a high density, Japanese Laid-Open Patent Publication No. 2014-040348, for example, discloses a technology for increasing the density of a compact to be sintered to a maximum possible level. In a sputtering target including a plurality of sintered compacts coupled together as described above, the difference in the density between adjacent sintered compacts (namely, the "inter-individual sintered compact variance" in the density) influences the sputtering characteristics.

As compared with a flat sintered compact, a cylindrical sintered compact is complicated in the contraction behavior when being sintered. When being contracted greatly, the cylindrical sintered compact is easily distorted. Like with the flat sintered compact, in the case where a highly dense cylindrical compact is formed in order to decrease the contraction amount during the sintering, a binder or the like included in the compact is not easily pulled off, which prevents the compact from having a desired shape as a result of the contraction.

SUMMARY

A cylindrical sputtering target in an embodiment according to the present invention includes a cylindrical sintered compact having a relative density of 99.7% or higher and 99.9% or lower.

A cylindrical sintered compact usable to manufacture a cylindrical sputtering target in an embodiment according to the present invention has a relative density of 99.7% or higher and 99.9% or lower.

In another embodiment, the cylindrical sputtering target includes a plurality of cylindrical sintered compacts adjacent to each other while having a space therebetween, and the plurality of cylindrical sintered compacts adjacent to each other may have a difference therebetween in the relative density of 0.1% or smaller.

A cylindrical compact usable to form a cylindrical sintered compact usable to manufacture a cylindrical sputtering target in an embodiment according to the present invention has a relative density of 54.5% or higher and 58.0% or lower.

In another embodiment, the cylindrical compact may be formed by cold isostatic pressing performed at a pressure of 100 MPa or higher and 200 MPa or lower.

DESCRIPTION OF EMBODIMENTS

Figure 1:
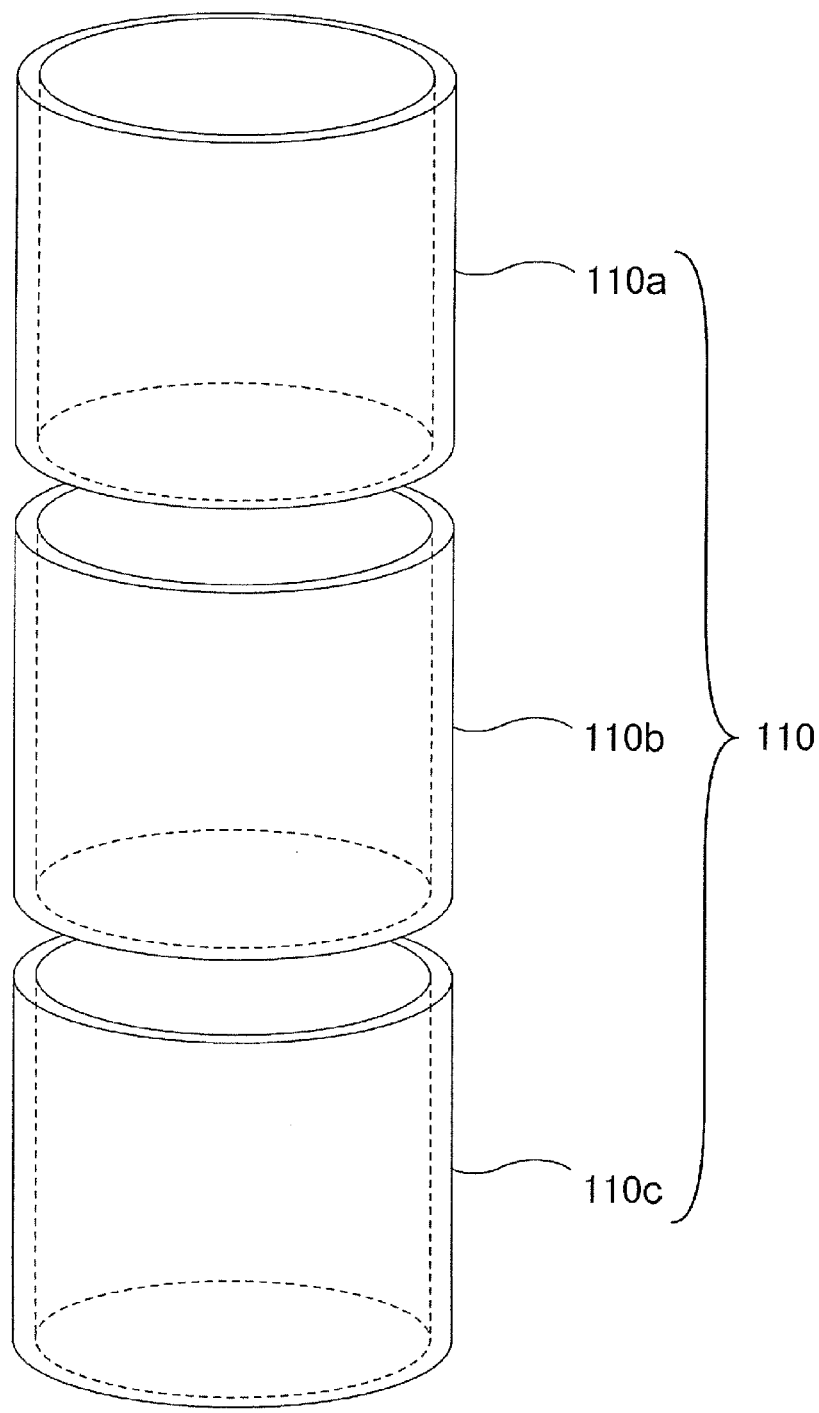
FIG. 1 is a perspective view showing an example of cylindrical sintered compacts included in a cylindrical sputtering target in an embodiment according to the present invention.

Hereinafter, a cylindrical sputtering target and a manufacturing method thereof according to an embodiment of the present invention will be described with reference to the drawings. The cylindrical sputtering target and the manufacturing method thereof according to an embodiment of the present invention may be carried out in various different embodiments, and are not to be construed as being limited to any of the following embodiments. In the drawings referred to in the embodiments, components that are the same or have substantially the same functions bear the identical reference signs, and detailed descriptions thereof may be omitted. The following embodiments are presented for the purpose of providing a cylindrical sputtering target, a cylindrical sintered compact and a cylindrical compact having little distortion and a high strength, and a manufacturing method of the same. An embodiment of the present invention has an object of providing a cylindrical sputtering target, a cylindrical sintered compact and a cylindrical compact having a highly uniform quality, and a manufacturing method of the same.

In the following description, the density of a compact and the density of a sintered compact are each expressed with the relative density. The "relative density" is represented by use of the theoretical density and the measured density; namely, the relative density=(measured density/theoretical density)×100(%). The "theoretical density" is a value of the density that is calculated based on the materials used. In the case where the materials are provided such that indium oxide has a content of 90% by mass and tin oxide has a content of 10% by mass, the theoretical density is calculated as (density of $In_2O_3$ (g/cm$^3$)×90+density of $SnO_2$ (g/cm$^3$)×10)/100. The density of $In_2O_3$ is calculated as 7.18 g/cm$^3$, and the density of $SnO_2$ is calculated as 6.95 g/cm$^3$. Thus, the theoretical density is calculated as 7.15 (g/cm$^3$). The "measured density" is a value obtained by dividing the weight by the volume. In the case of a compact, the measured density is calculated by use of the volume obtained by actually measuring the sizes. In the case of a sintered compact, the measured density is calculated by use of the volume obtained by the Archimedean Method.

The inter-sintered compact difference is the difference in the relative density. For example, the difference in the relative density between sintered compact A having a relative density of 99.5% and sintered compact B having a relative density of 99.6% is calculated as 99.6%−99.5%=0.1%. In the case where the sintered compacts have the same composition, the theoretical density of the sintered compacts is the same, Therefore, the variance between adjacent sintered compacts is evaluated by simply finding the difference between the adjacent sintered compacts. The maximum value among the differences between the adjacent sintered compacts is evaluated as the difference. The sputtering target according to an embodiment of the present invention is applicable to an assembly including a plurality of sintered compacts of the same composition that are coupled together.

Embodiment

With reference to FIG. 1 through FIG. 4, a structure of a cylindrical sputtering target and a structure of a cylindrical sintered compact in an embodiment according to the present invention will be described. First, with reference to FIG. 1 and FIG. 2, an overview of the cylindrical sputtering target will be described.

[Overview of the Cylindrical Sputtering Target]

FIG. 1 is a perspective view of an example of a plurality of cylindrical sintered compacts 110 included in a cylindrical sputtering target 100 in an embodiment according to the present invention. As shown in FIG. 1, the sputtering target 100 includes the plurality of cylindrical sintered compacts 110, which are hollow. The plurality of cylindrical sintered compacts 110 are located adjacent to each other while having a certain space therebetween. In FIG. 1, the space between each two adjacent cylindrical sintered compacts 110 is shown larger than the actual size for the sake of convenience, The cylindrical sintered compacts 110 each preferably have a relative density of 99.7% or higher and 99.9% or lower. The difference in the relative density between adjacent cylindrical sintered compacts 110a and 110b or between adjacent cylindrical sintered compacts 110b and 110c, namely, the inter-individual cylindrical sintered compact difference in the relative density is preferably 0.1% or smaller.

The cylindrical sintered compacts 110 may each have a thickness of 6.0 mm or greater and 15.0 mm or less. The cylindrical sintered compacts 110 may each have a length in an axial direction of 150 mm or greater and 380 mm or less. Adjacent cylindrical sintered compacts 110 may have a space having a length in the axial direction of 0.2 mm or greater and 0.5 mm or less. The sputtering target 100 preferably has an average surface roughness (Ra) of 0.5 µm or less.

The cylindrical sintered compacts 110 are preferably formed of a ceramic material such as ITO (indium tin oxide), IGZO (indium-gallium-zinc-oxide) or the like.

Figure 2:
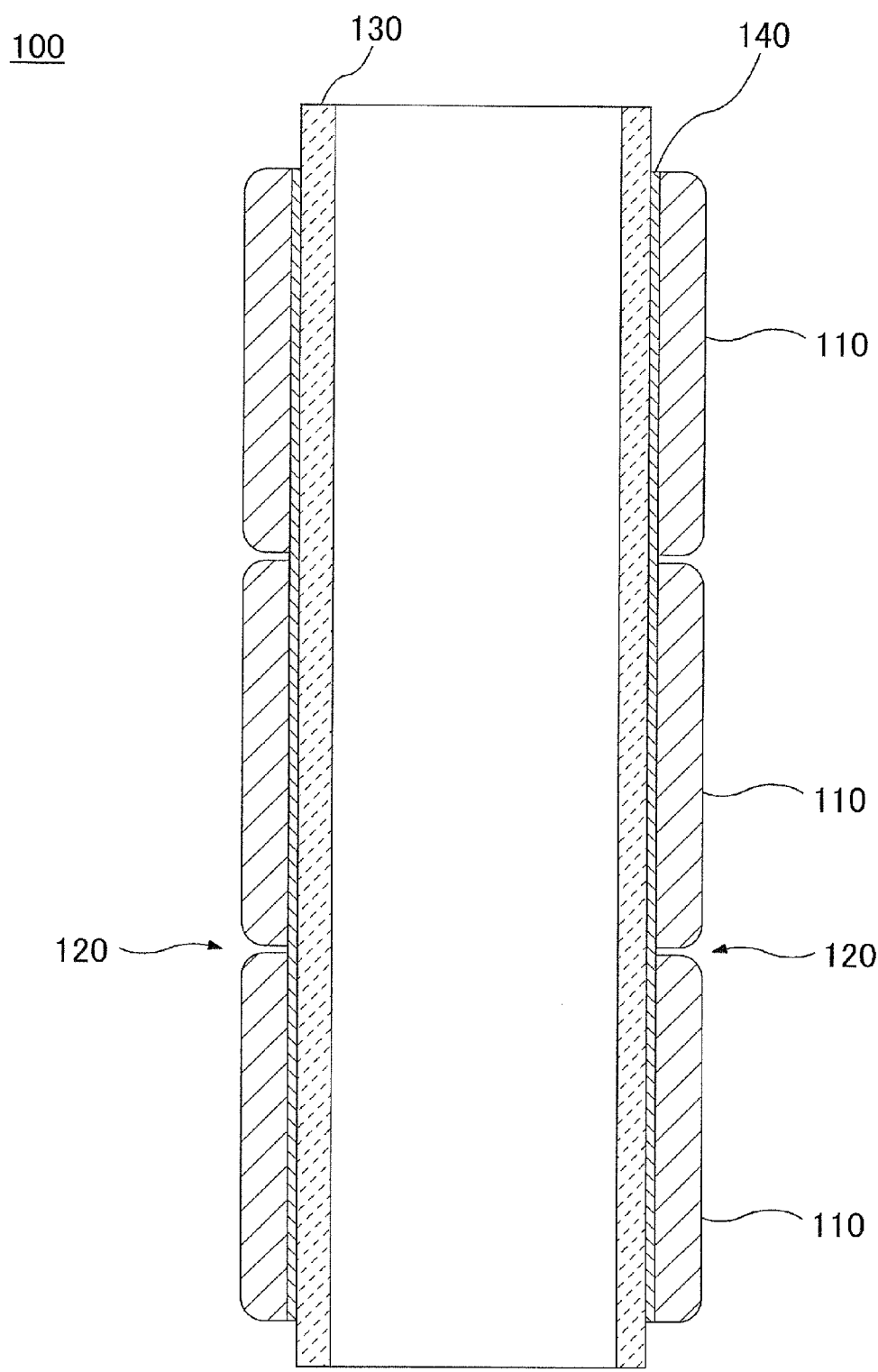
FIG. 2 is a cross-sectional view showing an example of cylindrical sputtering target in an assembled state in an embodiment according to the present invention.

FIG. 2 is a cross-sectional view showing an example of cylindrical sputtering target 100 in an embodiment according to the present invention in an assembled state. As shown in FIG. 2, the cylindrical sputtering target 100 in an assembled state includes a cylindrical substrate 130 in a hollow inside of the cylindrical sintered compacts 110 shown in FIG. 1. The cylindrical substrate 130 and the cylindrical sintered compacts 110 are joined together by blazing with a blazing member 140, and each two adjacent cylindrical sintered compacts 110 are located while having a space 120 therebetween.

The cylindrical substrate 130 may be formed of a metal material that has a sufficiently high thermal conductivity to efficiently release heat generated by collision of electrons and ions against the target at the time of sputtering of the target and also has a sufficiently high electrical conductivity to allow a bias voltage to be applied to the target. Specifically, the cylindrical substrate 130 may be formed of Ti, Cu, an alloy containing Ti or Cu, or stainless steel (SUS).

The blazing member 140 may be formed of a material having a high thermal conductivity and a high electrical conductivity like the cylindrical substrate 130 and also having a sufficiently high adhesiveness and strength to allow the cylindrical substrate 130 to retain the cylindrical sintered compacts 110. The thermal conductivity of the blazing member 140 may be lower than that of the cylindrical substrate 130. The electrical conductivity of the blazing member 140 may be lower than that of the cylindrical substrate 130. The blazing member 140 may be formed of, for example, indium (In), tin (Sn) or an alloy containing In or Sn.

As described above, in the sputtering target in this embodiment, the relative density of the cylindrical sintered compacts is in the above-described range, so that effects are provided that the mechanical strength of the cylindrical sintered compacts is improved and that a thin film formed of the cylindrical sintered compact contains less impurities and has an improved film density. In addition, the inter-individual cylindrical sintered compact difference in the relative density is in the above-described range, so that the distortion in the electric field is suppressed in the cylindrical sputtering target including the plurality of cylindrical sintered compacts. As a result, stable discharge characteristics are obtained at the time of sputtering, and a thin film having a highly uniform in-plane quality may be formed on a large substrate having a size exceeding the size of one cylindrical sintered compact.

[Manufacturing Method of the Cylindrical Sintered Compact]

Figure 3:
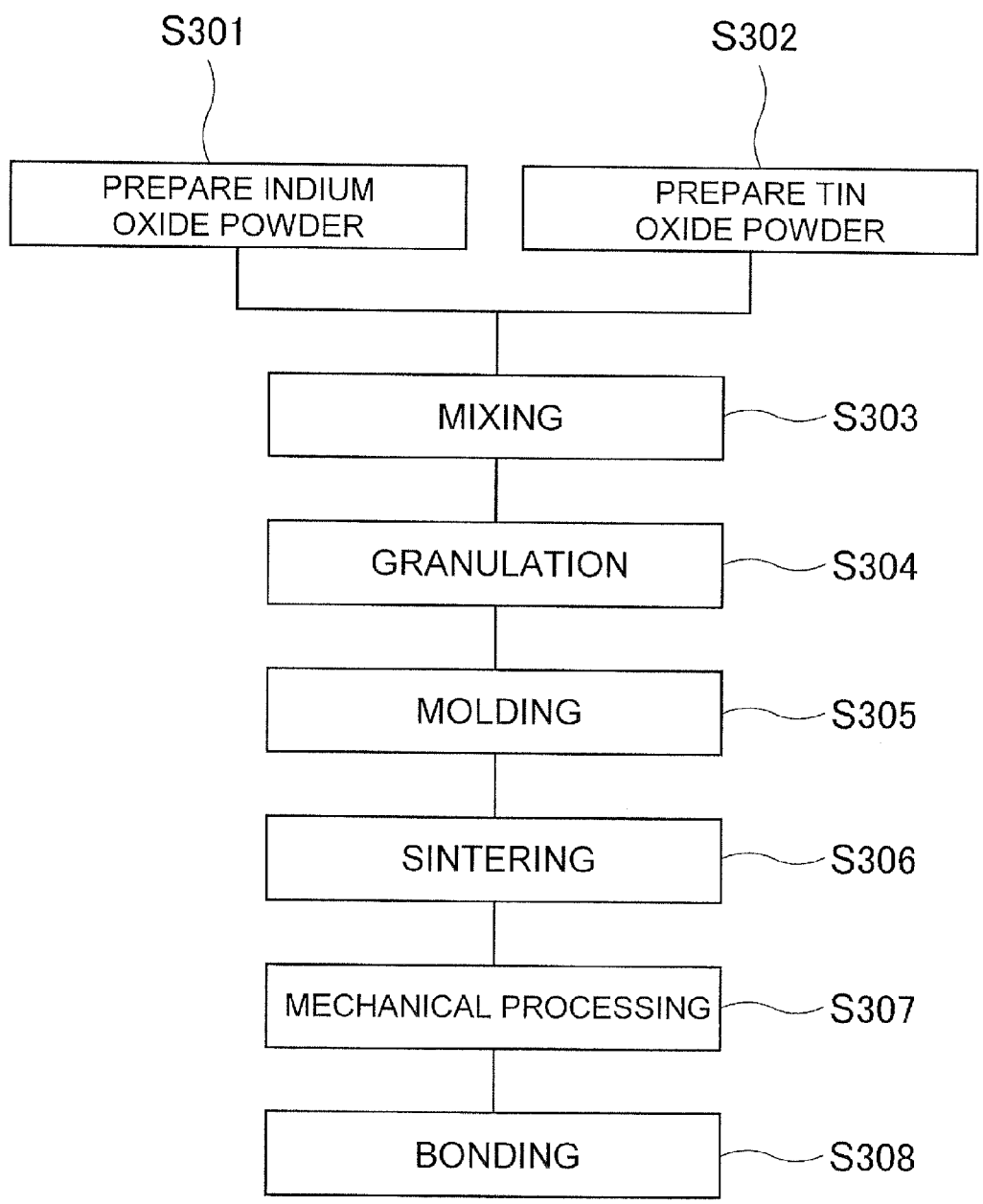
FIG. 3 shows a process flow of a manufacturing method of the cylindrical sintered compact and a cylindrical sputtering target in an embodiment according to the present invention.

Now, with reference to FIG. 3, a manufacturing method of a cylindrical sintered compact included in the cylindrical sputtering target according to an embodiment of the present invention will be described in detail. FIG. 3 shows a process flow of a manufacturing method of a cylindrical sintered compact and a cylindrical sputtering target in an embodiment according to the present invention. The sintered compact manufactured by the method shown in FIG. 3 contains ITO (indium tin oxide) as an example. The sintered compact is not limited to containing ITO, and the manufacturing method shown in FIG. 3 is applicable to a sintered compact containing IGZO or any other appropriate metal oxide material.

First, materials are prepared. The materials to be mixed are metal elements contained in, for example, an oxide or an alloy. The materials may be powdery, and appropriate materials may be selected in accordance with the composition of the sputtering target to be manufactured. In the case where, for example, ITO is used for the sintered compact, powder of indium oxide and powder of tin oxide are prepared (steps S301 and S302). These materials each have a purity of generally 2 N (99% by mass) or higher, preferably 3 N (99.9% by mass) or higher, or more preferably 4 N (99.99% by mass) or higher. In the case where the purity is less than 2 N, the cylindrical sintered compact contains a large amount of impurities, which causes a problem that desired physical properties are not obtained (for example, the permeability is decreased; the resistance of the film is increased; or in the case where the foreign substances are contained locally, arcing occurs and thus particles are generated).

Next, these powdery materials are pulverized and mixed (step S303). The powdery materials are pulverized and mixed by a dry method using balls or beads of zirconia, alumina, nylon resin or the like, a medium stirring mill method using such balls or beads, a medium-less container rotation method, a mechanical stirring method, a wet method using a gas stream. Generally, a wet method is superior to a dry method in pulverizing and mixing capabilities. Therefore, it is preferable to use the wet method for the mixing.

There is no specific limitation on the composition of the materials, and it is preferable to appropriately adjust the composition in accordance with the composition ratio of the sputtering target to be manufactured.

Use of powdery materials having a small powder diameter allows the sintered compact to have a high density. The powdery materials having such a small powder diameter may be obtained by using stricter conditions for the pulverization. However, in this case, the materials are contaminated with a larger amount of medium used for the pulverization (zirconia, etc.), which increases the concentration of impurities in the product. Therefore, the conditions for the pulverization need to be set to appropriate ranges in consideration of the balance between the density of the sintered compact and the concentration of the impurities in the product.

Next, a slurry of the powdery materials is dried and granulated (step S304). In this step, rapid dry granulation of rapidly drying the slurry may be performed. The rapid dry granulation may be performed by adjusting the temperature and the amount of the hot air by use of a spray dryer. The rapid dry granulation suppresses the powder of indium oxide and the powder of tin oxide from being separated from each other due to the difference in the precipitation rate, which is caused by the difference in the specific gravity between the powdery materials. Such a manner of granulation uniformizes the ratio of the components and thus improves the ease of handling of the powdery materials. Preliminary sintering may be performed before the granulation.

Next, the mixture obtained by the mixing step and the granulation step described above (in the case where the preliminary sintering step is performed, the preliminarily sintered mixture) is molded by pressurization to form a cylindrical compact (S305). In this step, the mixture or the preliminarily sintered mixture is formed into a shape preferable to the sputtering target to be manufactured. The molding may be performed by metallic molding, cast molding, injection molding or the like. In order to obtain a complicated shape such as a cylindrical shape or the like, the molding is preferably performed by cold isostatic pressing (CIP) or the like. The molding by CIP is performed as follows. A rubber mold is filled with the powdery materials each having a predetermined weight. At this point, the rubber mold is filled while being swung or tapped, so that the rubber mold is prevented from being filled with the powdery materials non-uniformly or from having a space therein. The molding by CIP is preferably performed at a pressure of 100 MPa or higher and 200 MPa or lower. In this embodiment, the pressure at the time of molding is adjusted as described above, so that a cylindrical compact having a relative density of 54.5% or higher and 58.0% or lower is formed. More preferably, the molding by CIP is performed at a pressure of 150 MPa or higher and 180 MPa or lower. In this case, a cylindrical compact having a relative density of 55.0% or higher and 57.5% or lower is formed.

Next, the cylindrical compact obtained by the molding step is sintered (step S306). The sintering is performed by use of an electric furnace. Sintering conditions may be appropriately selected in accordance with the composition of the sintered compact to be formed. For example, a sintered compact containing ITO that contains $SnO_2$ at a content of 10% by mass may be obtained by sintering performed at a temperature of 1500° C. or higher and 1600° C. or lower for a time duration of 10 hours or longer and 20 hours or shorter in an oxygen gas atmosphere. In the case where the sintering temperature is lower than 1500° C., the density of the sputtering target to be manufactured is too low. By contrast, in the case where the sintering temperature is higher than 1600° C., the electric furnace and the refractory material are excessively damaged and thus need to be subjected to maintenance whenever necessary, which significantly decreases the work efficiency. In the case where the sintering time duration is shorter than 10 hours, the density of the sputtering target to be manufactured is too low. In the case where the sintering time duration is longer than 20 hours, the compact is kept in the sintering step for too long, which deteriorates the operating ratio of the electric furnace. In addition, the amount of oxygen gas consumed in the sintering step and the electric power necessary to operate the electric furnace are increased. The sintering step may be performed at atmospheric pressure or in a reduced or increased pressure atmosphere.

In the case where an electric furnace is used for sintering, the increasing rate and the decreasing rate of the sintering temperature may be adjusted to suppress the generation of cracks. Specifically, the increasing rate of the temperature of the electric furnace during the sintering is preferably 300° C./hour or lower and more preferably 180° C./hour or lower. The decreasing rate of the temperature of the electric furnace during the sintering is preferably 600° C./hour or lower. The increasing rate and the decreasing rate of the temperature may be adjusted so as to be changed step by step.

The cylindrical compact is contracted by the sintering step. Before the temperature in the furnace reaches a level at which the thermal contraction of the cylindrical compact starts (at a temperature lower than the temperature at which the thermal contraction starts), the temperature in the furnace is retained at a certain level. This uniformizes the temperature in the furnace, and all of the sintered compacts located in the furnace are contacted uniformly. The sintering temperature and the sintering time duration may be set appropriately for each of materials of the cylindrical compact to be sintered, so that sintered compacts having a stable density are obtained.

Next, the obtained cylindrical sintered compacts are mechanically processed into a desired cylindrical shape by use of a mechanical processor such as a flat grinder, a cylindrical grinder, a lathe, a cutting machine, a machining center or the like (step S307). The mechanical processing is performed in order to allow the above-described cylindrical sintered compact to have a shape suitable to be attached to a sputtering device. The mechanical processing is performed also in order to cause the cylindrical sintered compact to have a desired surface roughness. The cylindrical sintered compact preferably has an average surface roughness (Ra) of 0.5 µm or less so as to be sufficiently flat to prevent abnormal discharge from being caused due to concentration of the electric field during sputtering. The cylindrical sintered compact obtained as a result of the above-described steps has a high density and a high quality uniformity.

Next, the mechanically processed cylindrical sintered compact is bonded to a substrate (step S308). Specifically in the case where a cylindrical sputtering target is to be manufactured, the cylindrical sintered compact is bonded to a cylindrical substrate called a "backing tube" with a blazing material used as an adhesive. As a result of the above-described steps being performed, a cylindrical sputtering target including a plurality of the above-described cylindrical sintered compacts is obtained.

As described above, according to the manufacturing method of the cylindrical sputtering target in this embodiment, the pressure at the time of molding may be 100 MPa or higher and 200 MPa or lower, so that cylindrical compacts having a relative density of 54.5% or higher and 58.0% or lower are obtained. The cylindrical compacts are sintered to stably obtain cylindrical sintered compacts having a very high density of 99.7% or higher and 99.9% or lower. In addition, the cylindrical sintered compacts are manufactured at a high reproducibility, and therefore the difference in the relative density between the plurality of cylindrical sintered compacts adjacent to each other is 0.1% or smaller.

Figure 4:
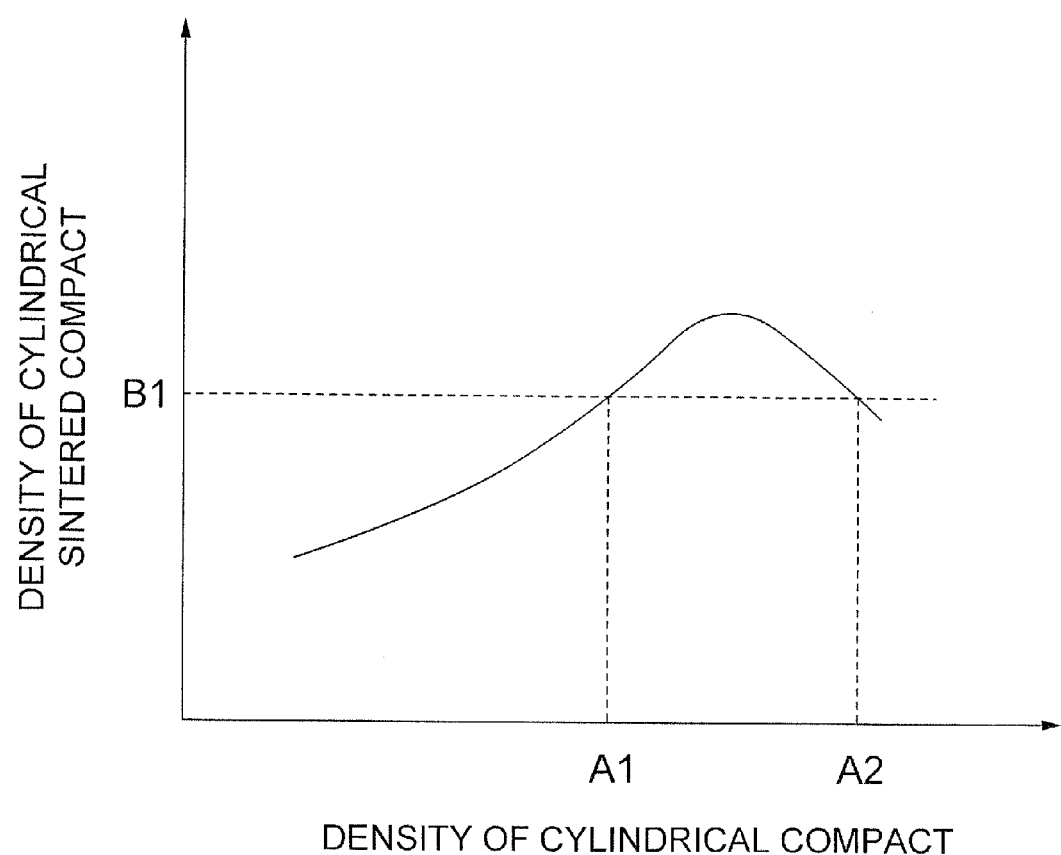
FIG. 4 shows the relationship between the density of the cylindrical compact and the density of the cylindrical sintered compact in the manufacturing method of the cylindrical sintered compact in the embodiment according to the present invention.

FIG. 4 shows the relationship between the density of the cylindrical compact and the density of the cylindrical sintered compact in the manufacturing method of the cylindrical sintered compact in the embodiment according to the present invention. In FIG. 4, the horizontal axis represents the density of the cylindrical compact, whereas the vertical axis represents the density of the cylindrical sintered compact obtained by sintering the cylindrical compact. The cylindrical compact in FIG. 4 is formed by molding performed at a pressure of 100 MPa or higher and 200 MPa or lower. The cylindrical sintered compact in FIG. 4 is obtained as a result of the cylindrical compact being sintered at a sintering temperature of 1560° C. for 20 hours. The densities is evaluated by the Archimedean Method.

As a result of active studies, the present inventors have found that in the case where the density of the cylindrical sintered compact is represented by the function of the density of the cylindrical compact as shown in FIG. 4, the density of the cylindrical sintered compact has a maximum. This will be described more specifically. Conventionally, it is considered that in order to obtain a cylindrical sintered compact having a high density, it is necessary to form a cylindrical compact having as high a density as possible. The studies made by the present inventors have found that there is a range of density of the cylindrical compact that is suitable to obtain a cylindrical sintered compact having a higher density. Especially in order to decrease the ratio of defective products caused by arcing or the like during use by a user, it is desirable that the cylindrical sintered compact has a relative density of 99.7% or higher. A cylindrical sintered compact having a relative density of 99.7% or higher is obtained in the case where the cylindrical compact has a relative density of 54.5% or higher and 58.0% or lower.

An embodiment of the present invention provides a cylindrical sputtering target, a cylindrical sintered compact and a cylindrical compact having little distortion and a high strength, and a manufacturing method of the same. An embodiment of the present invention also provides a cylindrical sputtering target, a cylindrical sintered compact and a cylindrical compact having a highly uniform quality, and a manufacturing method of the same.

EXAMPLES

Example 1

[Manufacturing of the Cylindrical Sputtering Target]

In example 1, a manufacturing method of a cylindrical ITO target (cylindrical sintered compact) will be described. First, 4 N indium oxide having a BET (Brunauer, Emmet and Teller's equation) specific surface area of 4.0 to 6.0 m$^2$/g and 4 N tin oxide having a BET specific surface area of 4.0 to 5.7 m$^2$/g were prepared as powdery materials. The "BET specific surface area" is a surface area obtained by the BET method. According to the "BET method", gas molecules of nitrogen, argon, krypton, carbon oxide or the like are adsorbed to solid particles, and the specific surface area of the solid particles is measured based on the amount of the adsorbed gas molecules. In this example, the materials were prepared such that indium oxide had a content of 90% by mass and tin oxide had at a content of 10% by mass, Next, these powdery materials were pulverized and mixed together by a wet ball mill. As the pulverization medium, zirconia balls were used. A slurry obtained as a result of the mixing was subjected to rapid dry granulation performed by use of a spray dryer.

Next, the mixture obtained by the granulation step was molded by CIP to have a cylindrical shape. The pressure at the time of molding by CIP was 150 MPa.

A cylindrical compact obtained by the molding step had the following parameters.

Outer diameter of the cylinder: 190 mm
Inner diameter of the cylinder: 159 mm
Length in the axial direction of the cylinder: 280 mm
Density of the compact: 4.00 g/cm$^3$
Relative density of the compact: 55.9%

The relative density of the cylindrical compact was calculated based on the size and the weight thereof.

Next, the cylindrical compact obtained by the CIP was sintered by use of an electric furnace. The sintering conditions were as follows.

Increasing rate of the temperature: 300° C./hour
Sintering temperature: 1560° C.
Sintering time duration: 20 hours
Atmosphere at the time of sintering: Oxygen atmosphere
Pressure at the time of sintering: Atmospheric pressure The cylindrical sintered compact obtained by the above-described sintering step had the following parameters.

Outer diameter of the cylinder: 157 mm

Inner diameter of the cylinder: 131 mm
Length in the axial direction of the cylinder: 230 mm
Density of the sintered compact: 7.131 g/cm$^3$
Relative density of the sintered compact: 99.7%

Namely, the contraction ratio of the cylindrical compact by the sintering step was 80%. In example 1, the difference in the relative density among a plurality of the cylindrical sintered compacts was 0.03%. The relative density of the cylindrical sintered compacts was measured by use of the Archimedean Method.

Next, the cylindrical sintered compact obtained by the sintering step was mechanically processed by use of a cylindrical grinder. The post-mechanical processing cylindrical sintered compact had a surface roughness Ra of 0.35 μm. The surface roughness was measured by use of a surface roughness meter (Mitutoyo Corporation; type: SJ301).

Next, two cylindrical sintered compacts obtained by the mechanical processing step were bonded to a backing tube to form a cylindrical sputtering target. The difference in the relative density between the two cylindrical sintered compacts bonded in this step was 0.1% or smaller. The backing tube had the following parameters.

Material: Ti
Outer diameter of the cylinder: 133 mm
Length in the axial direction of the cylinder: 300 mm

[Evaluation on the Cylindrical Sputtering Target]

The cylindrical sputtering target manufactured by the above-described method was used to perform a discharge test under the following conditions. Specifically, what ratio of the target was used, whether or not nodule was generated, the generation frequency of the nodule, whether or not abnormal discharge occurred, the occurrence frequency of the abnormal discharge, the cracks at the surface of the target were evaluated. These items were evaluated by visual inspection.

Argon gas flow rate: 300 sccm
Chamber pressure: 0.5 Pa
Power density: 4.0 W/cm$^2$
Film formation temperature: 200° C. (or room temperature)

The cylindrical sputtering target manufactured by the method in example 1 was subjected to a discharge test under the above-described conditions. 65% of the target was used. No nodule was generated, and the abnormal discharge did not occur. No crack was found at the surface of the target.

Example 2

In example 2, a cylindrical sintered compact obtained by sintering a cylindrical compact having a different relative density from that in example 1 will be described. In example 2, the parameters except for the pressure at the time of molding performed by CIP and the density of the compact were substantially the same as those in example 1 and thus will not be described. In example 2, the mixture obtained by the granulation step substantially the same as that in example 1 was molded by CIP to have a cylindrical shape. The pressure at the time of molding by CIP was 170 MPa. In example 2, the cylindrical compact had a density of 4.05 g/cm$^3$ and a relative density of 56.6%.

The cylindrical sintered compact obtained by sintering the above-described cylindrical compact by substantially the same method as that in example 1 had a density of 7.131 g/cm$^3$ and a relative density of 99.7%. In example 2, the difference in the relative density among a plurality of the cylindrical sintered compacts was 0.04%.

A cylindrical sputtering target manufactured by, for example, mechanical processing performed on a plurality of the above-described cylindrical sintered compacts by substantially the same method as that in example 1 was used to perform a discharge test under substantially the same conditions as those in example 1. Like in example 1, 65% of the target was used. No nodule was generated, and the abnormal discharge did not occur. No crack was found at the surface of the target.

Example 3

In example 3, a cylindrical sintered compact obtained by sintering a cylindrical compact having a different relative density from that in example 1 will be described. In example 3, the parameters except for the pressure at the time of molding performed by CIP and the density of the compact were substantially the same as those in example 1 and thus will not be described. In example 3, the mixture obtained by the granulation step substantially the same as that in example 1 was molded by CIP to have a cylindrical shape. The pressure at the time of molding by CIP was 180 MPa. In example 3, the cylindrical compact had a density of 4.11 g/cm$^3$ and a relative density of 57.5%.

The cylindrical sintered compact obtained by sintering the above-described cylindrical compact by substantially the same method as that in example 1 had a density of 7.131 g/cm$^3$ and a relative density of 99.7%. In example 3, the difference in the relative density among a plurality of the cylindrical sintered compacts was 0.06%.

A cylindrical sputtering target manufactured by, for example, mechanical processing performed on a plurality of the above-described cylindrical sintered compacts by substantially the same method as that in example 1 was used to perform a discharge test under substantially the same conditions as those in example 1. Like in example 1, 65% of the target was used. No nodule was generated, and the abnormal discharge did not occur. No crack was found at the surface of the target.

Comparative examples to the cylindrical compacts and the cylindrical sintered compacts in examples 1 through 3 will be described below. In each of the following comparative examples, a cylindrical sintered compact obtained by sintering a cylindrical compact having a different relative density from that in example 1 will be described. In the following comparative examples, the parameters except for the pressure at the time of molding performed by CIP, the density of the compact and the density of the sintered compact were substantially the same as those in example 1 and thus will not be described.

Comparative Example 1

In comparative example 1, the molding was performed by CIP at a pressure of 400 MPa. In comparative example 1, the cylindrical compact had a density of 4.40 g/cm$^3$ and a relative density of 61.5%, The cylindrical sintered compact obtained by sintering the above-described cylindrical compact by substantially the same method as that in example 1 had a density of 7.107 g/cm$^3$ and a relative density of 99.4%. A cylindrical sputtering target including a plurality of the above-described cylindrical sintered compacts was used to perform the above-described discharge test. Nodule was found to be generated and arcing was found to occur when 65% of the target was used.

Comparative Example 2

In comparative example 2, the molding was performed by CIP at a pressure of 300 MPa. In comparative example 2, the cylindrical compact had a density of 4.30 g/cm$^3$ and a relative density of 60.1%. The cylindrical sintered compact obtained by sintering the above-described cylindrical compact by substantially the same method as that in example 1 had a density of 7.107 g/cm$^3$ and a relative density of 99.4%. A cylindrical sputtering target including a plurality of the above-described cylindrical sintered compacts was used to perform the above-described discharge test. Nodule was found to be generated and arcing was found to occur when 65% of the target was used.

Comparative Example 3

In comparative example 3, the molding was performed by CIP at a pressure of 78.5 MPa. In comparative example 3, the cylindrical compact had a density of 3.79 g/cm$^3$ and a relative density of 53.1%. The cylindrical sintered compact obtained by sintering the above-described cylindrical compact by substantially the same method as that in example 1 had a density of 7.121 g/cm$^3$ and a relative density of 99.6%. A cylindrical sputtering target including a plurality of the above-described cylindrical sintered compacts was used to perform the above-described discharge test. Nodule was found to be generated and arcing was found to occur when 65% of the target was used.

An embodiment of the present invention is not limited to any of the above-described embodiments or examples, and may be modified in any way without departing from the gist thereof.

What is claimed is:

1. A cylindrical sputtering target, comprising:
a plurality of cylindrical sintered compacts adjacent to each other while having a space therebetween, the plurality of cylindrical sintered compacts containing ITO or IGZO and having a relative density of 99.7% or higher and 99.9% or lower, and the plurality of cylindrical sintered compacts adjacent to each other having a difference therebetween in the relative density of 0.1% or smaller,
wherein the relative densities of the plurality of cylindrical sintered compacts are different from each other.

* * * * *